(12) United States Patent
Pfeiffer

(10) Patent No.: US 7,970,561 B2
(45) Date of Patent: Jun. 28, 2011

(54) METHOD TO CALCULATE ENERGY EFFICIENCY OF INFORMATION TECHNOLOGY EQUIPMENT

(75) Inventor: Clemens Pfeiffer, Sunnyvale, CA (US)

(73) Assignee: Power Assure, Inc., Santa Clara, CA (US)

( * ) Notice: Subject to any disclaimer, the term of this patent is extended or adjusted under 35 U.S.C. 154(b) by 522 days.

(21) Appl. No.: 12/102,628

(22) Filed: Apr. 14, 2008

(65) Prior Publication Data

US 2009/0259417 A1 Oct. 15, 2009

(51) Int. Cl.
*G06F 19/00* (2006.01)
(52) U.S. Cl. .......................... 702/60; 713/320
(58) Field of Classification Search .................. 702/60, 702/64, 182–185; 713/320
See application file for complete search history.

(56) References Cited

U.S. PATENT DOCUMENTS

2006/0229847 A1\* 10/2006 Nakajima ................... 702/183
\* cited by examiner

*Primary Examiner* — Edward Raymond
(74) *Attorney, Agent, or Firm* — DLA Piper LLP (US)

(57) ABSTRACT

The present invention provides a METHOD TO CALCULATE AN ENERGY EFFICIENCY RATING for information technology equipment. This method specifically pertains to information technology equipment that doubles its capabilities in a predetermined timeframe according to Moore's Law.

This method uses a formula to calculate an energy efficiency rating based on power consumption and transactions per second. It further calculates a normalized rating where the absolute rating is adjusted based on Moore's Law prediction of improvements. As a result the method invented is the first and only method to compare information technology from various generations of hardware, processor and component architecture with each other in terms of their energy efficiency.

8 Claims, 1 Drawing Sheet

Vintage PAR4 normalized rating

Figure 1 – Vintage PAR4 normalized rating
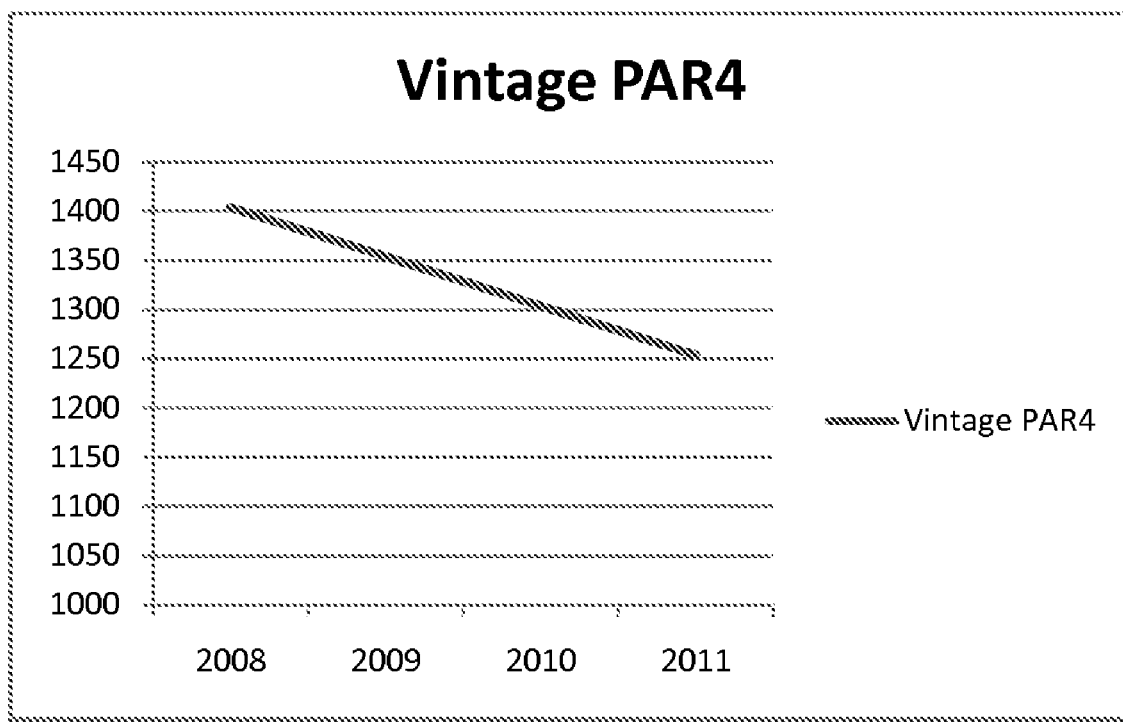

METHOD TO CALCULATE ENERGY EFFICIENCY OF INFORMATION TECHNOLOGY EQUIPMENT

BACKGROUND OF THE INVENTION

This present invention relates to power consumption of information technology equipment and specifically servers.

Servers and other information technology equipment consume large amounts of energy. The energy consumption is depending on the load of the server and increases as load increases. Depending on the components used in such information technology equipment, the energy consumption is significantly different even between equipment that has similar performance characteristics and capabilities.

Furthermore every type of information technology equipment also provides different levels of capacity for the applications that they run, also called performance indicator(s), and typically measured in terms of transactions per second. Such a performance indicator is used to compare different equipment against each other.

As of today such performance indicators do not include energy efficiency of such equipment relative to said performance.

While performance ratings by transactions per second are common this invention extends such measures with the associated power consumption to calculate a rating of transactions per watt of power consumption to document the efficiency of the equipment when compared to other equipment.

Furthermore information technology equipment evolution is based on "Moores Law" that states that computers will double their capacity every 2 years.

As Wikipedia states: Moore's Law describes an important trend in the history of computer hardware: that the number of transistors that can be inexpensively placed on an integrated circuit is increasing exponentially, doubling approximately every two years. The observation was first made by Intel co-founder Gordon E. Moore in a 1965 paper. The trend has continued for more than half a century and is not expected to stop for another decade at least and perhaps much longer.

Almost every measure of the capabilities of digital electronic devices is linked to Moore's Law: processing speed, memory capacity, even the resolution of digital cameras. All of these are improving at (roughly) exponential rates as well. This has dramatically increased the usefulness of digital electronics in nearly every segment of the world economy. Moore's Law describes this driving force of technological and social change in the late 20th and early 21st centuries.

Following Moore's Law means that the transactions per Watt of energy consumption will also double every 2 years and as such any rating for information technology equipment that is based on technology innovation that follows Moore's Law has to factor this in to allow for a useful comparison of such equipment relative to its release date.

1. Field of the Invention

This invention pertains specifically to a method for calculating the energy efficiency of servers and other information technology equipment.

Moreover, this invention allows the creation of a consistent and common measurement of performance per energy consuming component over time considering the continued capability improvement of IT equipment as defined by "Moore's Law".

Moreover, this invention gives purchasing guidance based on energy efficiency ratings by comparing equipment not just on features, performance and price but also on their energy efficiency.

2. Description of Related Art

Today there is no common method to compare information technology equipment that includes a component for energy efficiency. Today's benchmarks are usually used to select equipment based on its performance (transactions per second) and not based on its energy efficiency in relation to its performance (transactions per kWh). While today the best performance is still a fairly common measure, best performance for a said energy consumption is much more meaningful for cost sensitive organizations.

SUMMARY OF THE INVENTION

In view of the limitations of the prior art, this invention defines a method by which information technology equipment can be compared on their energy efficiency in either an absolute rating or relative to each other in a normalized rating.

Absolute rating (called PAR4 rating—PAR4 is a trademark of Power Assure, Inc.) means transactions per kWh of energy consumption. This number will be higher with each new generation of equipment as their capacity, performance and capabilities increases (See Moore's Law). A higher number represents better energy efficiency by performing more transactions per kWh of energy.

Normalized rating (called Vintage PAR4) means a number relative to a defined date in the past, normalized against performance increases as expected by Moore's Law. This means that every two years the number of transactions per kWh has to double to achieve the same normalized rating.

Furthermore this invention allows for normalized ratings to create standards to be achieved by energy efficiency ratings, e.g. Platinum, Gold, Silver, etc. to indicate that equipment is more or less efficient without looking to the detailed normalized rating. Furthermore this invention also claims that normalized ratings can be forecasted for each year in the future. (See FIG. 1) The normalized rating for a single piece of equipment will go down over time as its efficiency relative to Moore's Law increases in performance at the same amount of energy use will be lower than new equipment, giving the equipment buyer a chance to determine the optimal time to replace such equipment.

Furthermore the method presented in this innovation calculates all ratings on a logarithmic scale to be in line with Moore's Law which is defined by exponential growth.

Absolute ratings (PAR4) are calculated according to the following formula:

$$PAR4 = \log_2(tps/watt) * 100$$

With tps being transactions per second
watt being watt of power consumption at 100% load
Normalized ratings are calculated according to the following formula:

$$\text{Vintage PAR4} = \log_2(tps/(watt * proc * 2^{(cyr-nsyr)/mly})) * 100$$

With tps being transactions per second,
watt being watt of power consumption at 100% load,
proc being the number of processors (not cores within a processor),
cyr being the current year,
nsyr being the start year of the normalization
mly being the number of years per Moore's law for said equipment for a 2 times performance increase Using both calculations can easily classify equipment on their energy efficiency either in absolute terms or relative to past and future equipment. While this invention does not limit the precision of the resulting rating, the examples used will show integer values without decimals.

DESCRIPTION OF THE DRAWINGS

FIG. 1 shows a normalized rating graph for a single server for today, next year and in the future. As shown, the normalized rating goes down over time as performance should increase by a factor of 2 every 2 years while using the same amount of power—as a result the rating drops by a similar factor every 2 years.

DETAILED DESCRIPTION OF THE INVENTION

In one aspect, the present invention fulfills the above described needs in the art by providing a new method to establish energy efficiency ratings for information technology equipment that has many novel features and advantages not offered by the prior art, like:

1. A method to calculate a PAR4 rating as an absolute rating of said equipment's energy efficiency in terms of transactions per kWh.
2. A method to calculate a Vintage PAR4 rating as a normalized rating of said equipment's energy efficiency adjusted by Moore's Law improvements in performance and efficiencies.

The result is a new method for energy efficiency rating of information technology equipment, which is not apparent, obvious, or suggested, either directly or indirectly by any of the prior art.

OPERATIONAL EXAMPLE

Using this method to rate information technology equipment will show easy comparison in absolute ratings and normalized ratings. As an example the following server will be used to demonstrate the use of this invention:
Server:
Supermicro with dual Intel Xeon X5450 Quad Core, 100 GB Hard disk, 2 GB Memory The number of transactions per second under full load using all 8 cores (4 cores on each of the 2 processors) is 131,000,000. The power consumption at such a load level has been measured as 243 Watt.

$$PAR4 = int(\log_2(131{,}000{,}000/243) * 100) = 1904$$

If the same server would run less transactions per second e.g. 50,000,000 the par4 rating would be lower as well:

$$PAR4 = int(\log_2(50{,}000{,}000/243) * 100) = 1765$$

(Note: Integer adjustments done to get rounded down numbers)

Calculating the normalized rating for the year 2008 based on a historic date of 2000 will look like this:

$$\text{Vintage PAR4} = int(\log_2(131000000/(243*2*2^{(2280-2000)/2})) * 100) = 1404$$

For 2009 the same server would get a Vintage PAR4 normalized rating of:

$$\text{Vintage PAR4} = int(\log_2(131000000/(243*2*2^{(2009-2000)/2})) * 100) = 1354$$

For 2010 the same server would get a Vintage PAR4 normalized rating of:

$$\text{Vintage PAR4} = int(\log_2(131000000/(243*2*2^{(2120-2000)/2})) * 100) = 1304$$

I claim:

1. A method to calculate energy efficiency of information technology equipment, comprising:
   determining a transactions per second value for a piece of information technology equipment;
   determining a power consumption at 100% load value for the piece of information technology equipment; and
   calculating an energy efficiency of the piece of information technology equipment by dividing the transactions per second value by the power consumption at 100% load value.

2. The method of claim 1, wherein calculating the energy efficiency further comprises calculating an absolute rating of energy efficiency of the information technology equipment.

3. The method of claim 1, wherein calculating the energy efficiency further comprises calculating a normalized rating of energy efficiency of information technology equipment over time.

4. The method of claim 1 further comprising generating a normalized ratings graph for information technology equipment that shows the expected rating of such equipment over time and in the future.

5. The method of claim 1 further comprising using the energy efficiency to give purchasing guidance based on said energy efficiency ratings so that equipment purchasing decisions can include performance per energy usage.

6. The method of claim 2, wherein calculating the absolute rating of energy efficiency of the information technology equipment further comprises using the formula:

$$\text{Log}_2(tps/watt) * 100$$

wherein tps is the transactions per second value and watt is the power consumption at 100% load value.

7. The method of claim 3, wherein calculating the normalized rating of energy efficiency further comprises using the formula:

$$\text{Log}_2(tps/watt * proc * 2^{(cyr-nsyr)mly}) * 100$$

wherein tps is the transactions per second value, watt is the power consumption at 100% load value, proc is a number of processors in the information technology equipment, cyr is a current year, nsyr is a start year of the normalization, and mly is a number of years per Moore's law for said equipment for a 2 times performance increase.

8. The method of claim 1, wherein calculating an energy efficiency further comprises calculating an energy efficiency of the piece of information technology equipment by taking a logarithm of the transactions per second value divided by the power consumption at 100% load value.

* * * * *